(12) United States Patent
Erturk et al.

(10) Patent No.: US 7,659,598 B2
(45) Date of Patent: Feb. 9, 2010

(54) SEMICONDUCTOR GROUND SHIELD

(75) Inventors: Mete Erturk, St. Albans, VT (US); Alvin J. Joseph, Williston, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/371,662

(22) Filed: Feb. 16, 2009

(65) Prior Publication Data

US 2009/0146247 A1    Jun. 11, 2009

Related U.S. Application Data

(63) Continuation of application No. 10/908,354, filed on May 9, 2005, now Pat. No. 7,501,690.

(51) Int. Cl.
*H01L 29/70* (2006.01)
(52) U.S. Cl. .............................. 257/508; 257/E21.641
(58) Field of Classification Search ............... 257/499, 257/501, 503, 508, E21.641, E21.642
See application file for complete search history.

(56) References Cited

U.S. PATENT DOCUMENTS

| | | | |
|---|---|---|---|
| 5,485,029 A | 1/1996 | Crabbe et al. |
| 5,930,668 A | 7/1999 | Gardner |
| 6,071,803 A | 6/2000 | Rutten et al. |
| 6,094,812 A | 8/2000 | English et al. |
| 6,500,743 B1 | 12/2002 | Lopatin et al. |
| 6,566,242 B1 | 5/2003 | Adams et al. |
| 6,611,041 B2 | 8/2003 | Maeda et al. |
| 6,956,289 B2 | 10/2005 | Kunikiyo |
| 2004/0004255 A1 | 1/2004 | Yoshimura |
| 2004/0169217 A1 | 9/2004 | Houston |
| 2004/0222528 A1* | 11/2004 | Kunikiyo .................... 257/758 |

FOREIGN PATENT DOCUMENTS

JP       2000124283 A      4/2000

OTHER PUBLICATIONS

IBM Global Services China Ltd, "Information Disclosures Statement," Jun. 13, 2008, 1 page.
Erturk et al., U.S. Appl. No. 10/908,354, filed May 9, 2005, Supplemental Notice of Allowability, Feb. 4, 2009, 4 pages.
Erturk et al., U.S. Appl. No. 10/908,354, filed May 9, 2005, Notice of Allowance and Fee(s) Due, Jul. 22, 2008, 18 pages.
Erturk et al., U.S. Appl. No. 10/90,354, filed May 9, 2005, Office Action Summary, Apr. 4, 2008, 11 pages.

* cited by examiner

*Primary Examiner*—Brook Kebede
(74) *Attorney, Agent, or Firm*—Richard Kotulak; Hoffman Warnick LLC

(57) ABSTRACT

A ground shield is disclosed that includes a 'cheesed' metal positioned within a dielectric layer and a metal region positioned within a first metal level over the cheesed metal. The ground shield can have different forms depending on the metal used, and provisions are made to prevent diffusion of copper (Cu) when that is used as the metal in the cheese metal of the ground shield. The ground shield provides a low resistance, very thick metal at a first metal (M1) level for passive RF elements in conjunction with the standard back-end-of-line (BEOL) integration. The invention also includes a method of forming the ground shield.

19 Claims, 10 Drawing Sheets

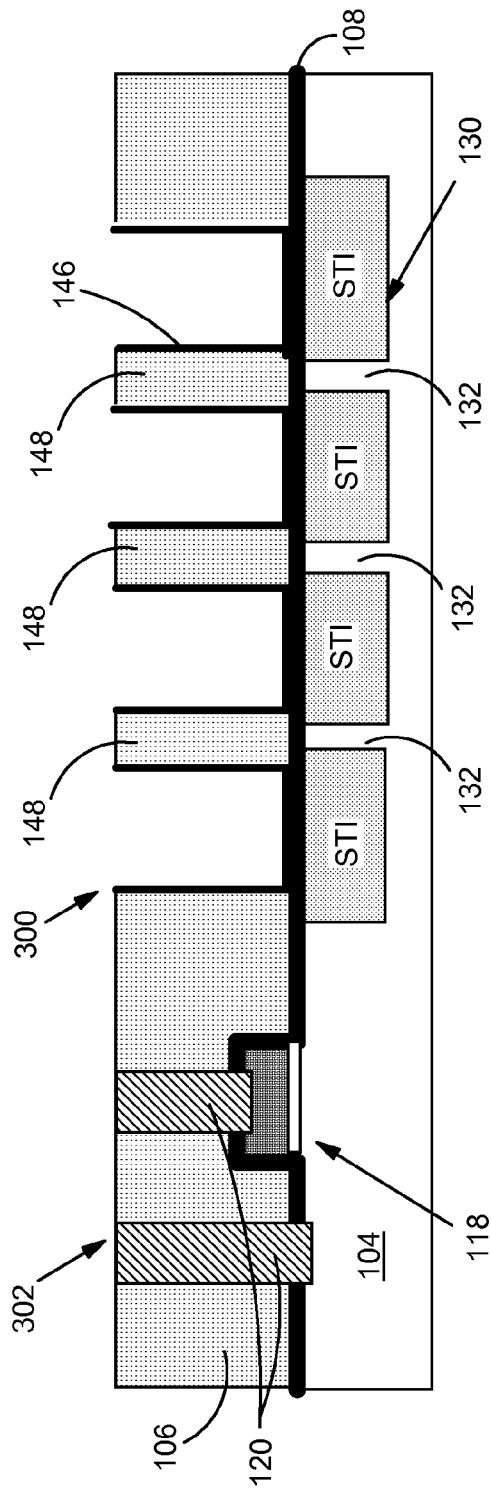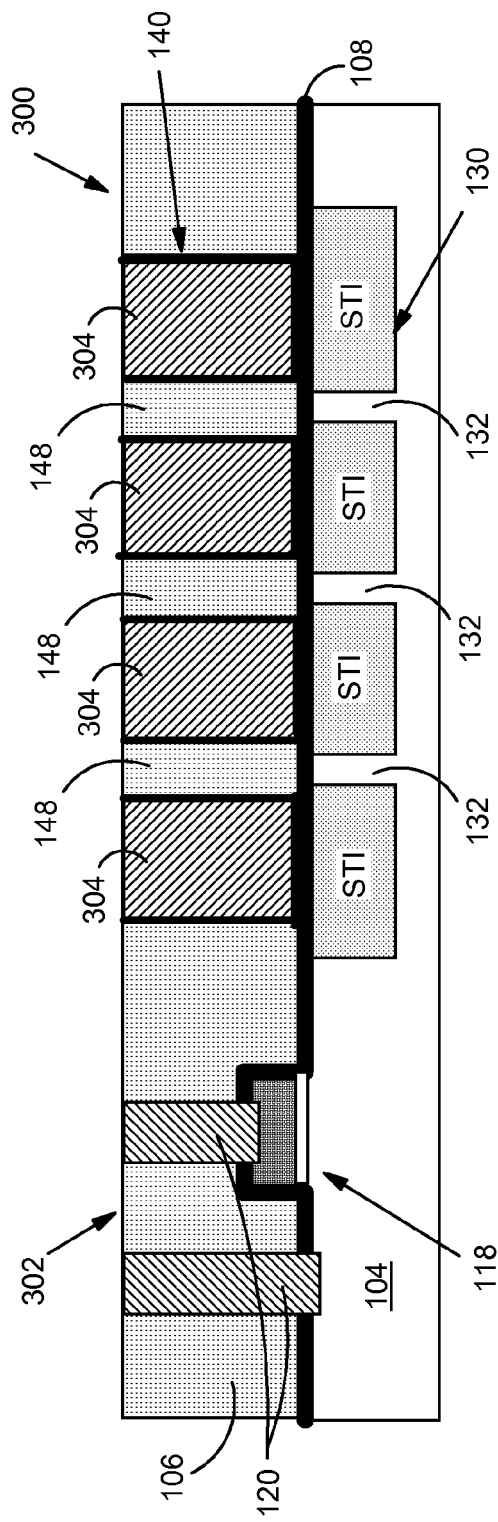

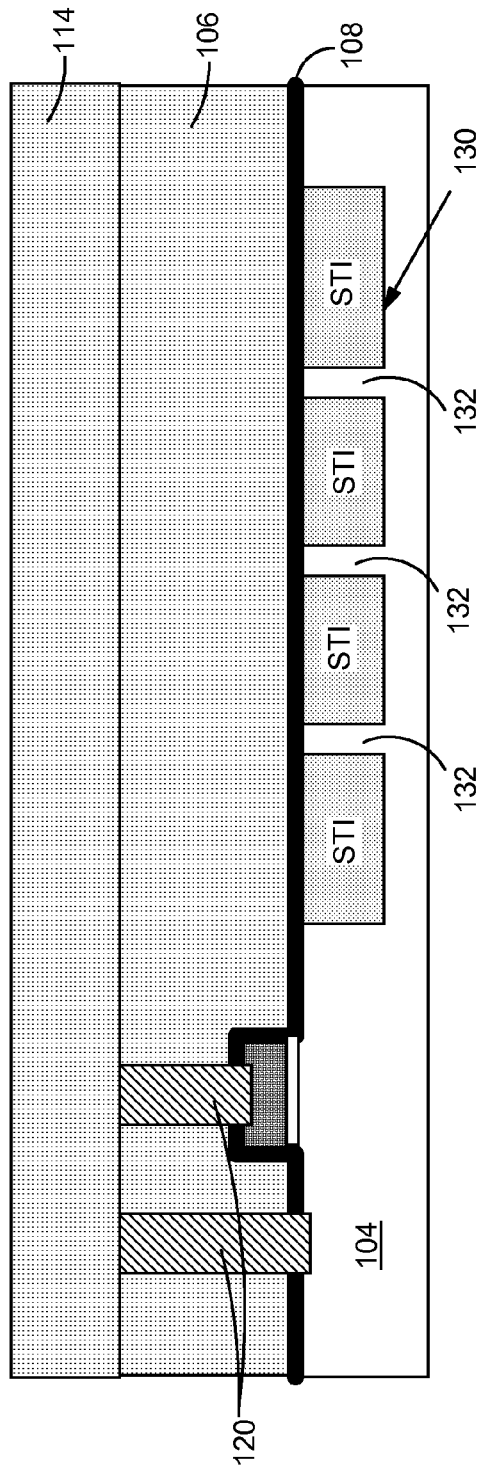
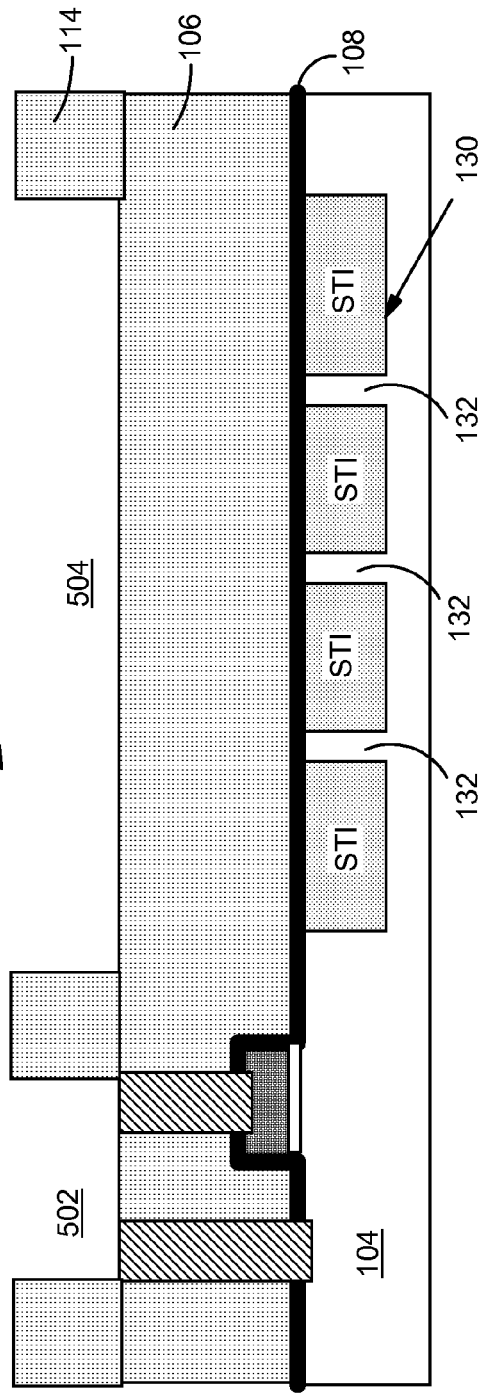
FIG. 5A
FIG. 5B

SEMICONDUCTOR GROUND SHIELD

This application is a Continuation of U.S. patent application Ser. No. 10/908,354, filed May 9, 2005 now U.S. Pat. No. 7,501,690.

BACKGROUND OF THE INVENTION

Technical Field

The present invention relates generally to semiconductor fabrication, and more particularly, to a ground shield for a semiconductor device and a related method.

RELATED ART

In silicon radio frequency (RF) applications, magnetic fields created by current flowing through RF passive elements (e.g., inductors, capacitors, transmission lines, etc.) creates eddy currents in the underlying conductors and silicon substrate. As a result, the magnetic field dissipates power in the silicon, and degrades the quality factor of the RF passive element. To address this situation, the lossy silicon substrates are often shielded from RF passive elements by a metal ground shield or ground plane, which provides a low resistance return path for the magnetic field-induced electrical current. A ground shield is typically located on top of the silicon substrate and under the RF passive element to block eddy currents from entering the substrate.

Current practice is to use the available first metal (M1) wiring level to provide a ground shield in various complementary metal-oxide semiconductors (CMOS), bipolar CMOS (BiCMOS), silicon germanium (SiGe) BiCMOS, RF-CMOS, etc., technologies. This approach, however, suffers from a number of drawbacks. For example, ideally the ground shield should be as thick as possible to minimize the resistance and block as much of the eddy currents as possible. In contrast, the first metal wiring level is ideally as thin as possible to facilitate tight pitch wiring. For example, a typical 90 nm CMOS generation first metal (M1) wiring pitch and height are approximately 220 nm and approximately 240 nm, respectively; while a passive inductor pitch and height are approximately 2.4 µm and approximately 3 µm, respectively. Accordingly, if the ground shield is made thicker, the aspect ratio of the metal wire is increased, which detrimentally results in higher metal resistances for the ground shield. The ground shield also disadvantageously increases capacitance between conductors and ground. This situation occurs, for example, in aluminum (Al) or copper (Cu) metal systems. For a low loss ground shield, the wire resistance should be very negligible, i.e., the ground shield needs to act as a nearly ideal ground with minimal power loss. For power amplifier technologies, in particular, the return loss on the ground shield can be a substantial limiting factor in efficiency (i.e., wasted power in inductors due to I*I*R*f).

In view of the foregoing, there is a need in the art for an improved ground shield.

SUMMARY OF THE INVENTION

The invention includes a ground shield that includes a 'cheesed' metal positioned within a dielectric layer, and a metal region positioned within a first metal level over the cheesed metal. The ground shield can have different forms depending on the metal used, and provisions are made to prevent diffusion of copper (Cu) when that is used as the metal in the cheese metal of the ground shield. The ground shield provides a low resistance, very thick metal at a first metal (M1) level for passive RF elements in conjunction with the standard back-end-of-line (BEOL) integration. The invention also includes a method of forming the ground shield.

A first aspect of the invention is directed to a structure comprising: a substrate having a dielectric layer positioned thereover; a metal level positioned over the dielectric layer; and a ground shield including: a cheesed metal positioned within the dielectric layer, and a metal region positioned within the metal level over the cheesed metal.

A second aspect of the invention includes a method of forming a ground shield, the method comprising the steps of: providing a substrate having a silicon trench isolation (STI) region therein and at least one dielectric layer separated from the substrate by an etch stop layer; and forming the ground shield by forming a cheesed metal in a first dielectric layer over the substrate and a metal region in electrical contact with the cheesed metal in a second dielectric layer over the first dielectric layer.

A third aspect of the invention related to a ground shield for a semiconductor device, the ground shield comprising: a metal region in a first metal level of the semiconductor device; and a cheesed metal positioned in a dielectric layer below the metal region, each of a plurality of dielectric pegs of the cheesed metal being aligned with a fill peg of an underlying, cheesed silicon trench isolation (STI) region.

A fourth aspect of the invention is directed to a ground shield for a semiconductor device, the ground shield comprising: a first cheesed metal region in a first metal level of the semiconductor device; and a second cheesed metal region positioned in a dielectric layer below the first cheesed metal region, each of a plurality of dielectric pegs of the second cheesed metal region being aligned with a fill peg of an underlying, cheesed silicon trench isolation (STI).

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein:

FIGS. 4A-C show one embodiment of a method of forming a ground shield according to the invention.

FIGS. 5A-D show another embodiment of a method of forming a ground shield according to the invention.

DETAILED DESCRIPTION

Figure 1A:
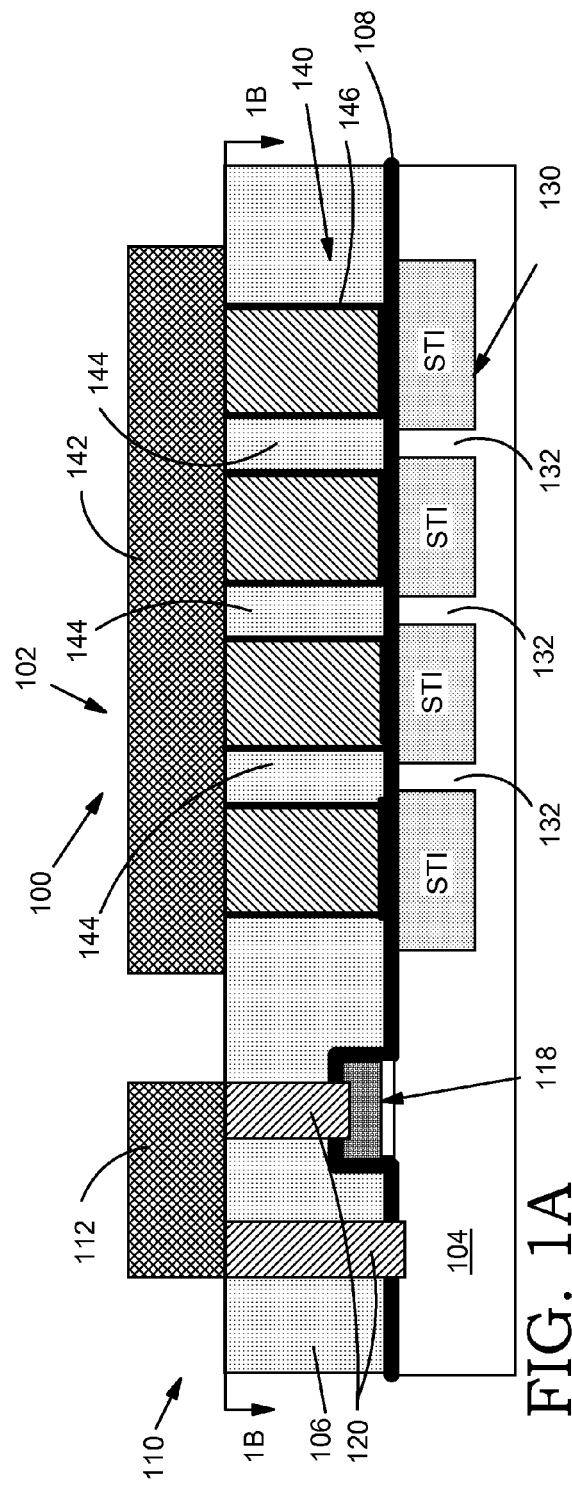
FIGS. 1A-B show a first embodiment of a ground shield according to the invention.
Figure 1B:
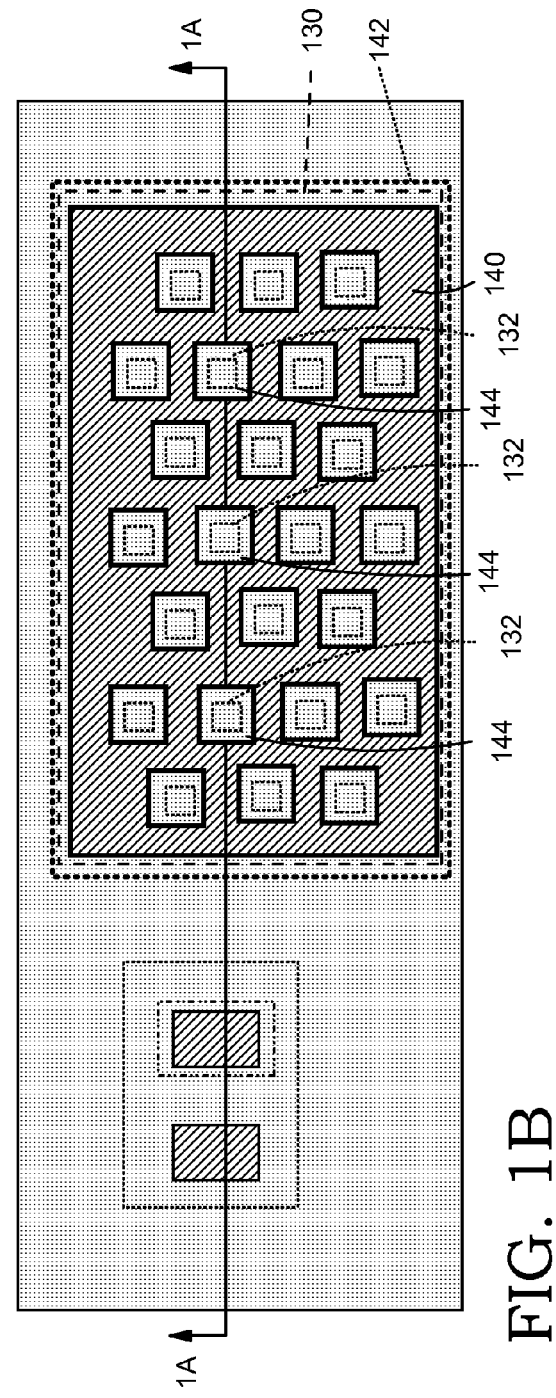

With reference to the accompanying drawings, FIGS. 1A-B show a ground shield 100 in accordance with a first embodiment of the invention. FIG. 1B shows a plan view along line 1B-1B of FIG. 1A; similarly, FIG. 1A shows a cross-sectional view along line 1A-1A of FIG. 1B. Referring to the cross-sectional view of FIG. 1A, ground shield 100 includes a structure 102 including a substrate 104, i.e., of silicon, having a dielectric layer 106 positioned thereover.

Dielectric layer 106 (hereinafter pre-metal dielectric (PMD) layer 106) may include any now known or later developed dielectric material, such as silicon dioxide ($SiO_2$), hydrogenated silicon oxycarbide (SiCOH), phosphosilicate glass (PSG), boro-phosphosilicate glass (BPSG), etc., deposited using an known method such as plasma enhanced chemical vapor deposition (PECVD), high density plasma CVD (HD-PCVD), sub-atmospheric CVD (SACVD), atmospheric pressure CVD (APCVD), atomic layer deposition (ALD), liquid phase chemical vapor deposition (LPCVD), or the like. A dielectric reactive ion etch (RIE) stop layer 108 for etching contacts 120 and a cheesed metal 140 of ground shield 100 (described below) is preferably positioned over substrate 104, i.e., provided between PMD layer 106 and substrate 104, and may also can act as a mobile ion diffusion barrier layer. Etch stop layer 108 may include any conventional barrier material such as silicon nitride ($Si_3N_4$), silicon carbide (SiC), silicon carbo-nitride (SiCN) or the like, and is deposited using any known method in the art, such as PECVD, HDPCVD, SACVD, APCVD, ALD, LPCVD, etc.

A first metal (M1) level 110 is positioned over PMD layer 106, fabricated using a subtractive etch process as known in the art. First metal level 110 includes a metal wire 112. Metal wire 112, in this example, is coupled to a gate and extension of a transistor 118 in PMD layer 106 via contacts 120. Contacts 120 may include tungsten (W) or any other typical contact material, and typically have a thin liner material (not shown), such as titanium nitride (TiN), as known in the art. As will be described below, contacts 120 may be formed simultaneously with ground shield 100.

Substrate 104 further includes a silicon trench isolation (STI) region 130 that is cheesed to prevent dishing during planarization, i.e., chemical mechanical polishing. STI region 130 includes a plurality of fill (substrate) pegs 132. As illustrated in FIG. 1B, 'cheesed' means that STI region 130 is provided, by design, with portions (pegs) 132 of silicon substrate 104 extending therethrough leaving a 'swiss cheese' appearance from above. The term 'cheesed,' as will be described below, may also apply to metal, which may have portions of a metal wire removed with dielectric extending therethrough leaving a 'swiss cheese' appearance from above. The purpose of cheesing is to decrease the local pattern factor of the wiring or STI region 130 to decrease chemical mechanical polishing (CMP) dishing or erosion resulting in increased wire resistance for the wiring and/or the creation of topography, as known in the art.

Ground shield 100 includes cheesed metal 140 positioned within PMD layer 106, and a metal region 142 positioned within first metal level 110 and electrically connected to cheesed metal 140. FIGS. 1A-B show a first embodiment of ground shield 100 in which cheesed metal 140 is fully bordered within a periphery of metal region 142, which is shown in phantom in FIG. 1B. In this case, metal region 142 may include aluminum copper (Al—Cu), with standard titanium nitride (TiN) or other refractory metal cladding layers, as known in the art, preferably fabricated using a subtractive etch process, as known in the art. As shown in FIG. 1A, cheesed metal 140 preferably extends to, but not completely through, etch stop layer 108. In one preferred embodiment, cheesed metal 140 is also fully bordered within a periphery of STI region 130, which is also shown in phantom in FIG. 1B. In addition, in this embodiment, cheesed metal 140 is also preferably never directly over silicon 104, either by design or due to lithographic or RIE variability in dimension or registration. To achieve this structure, each of a plurality of dielectric pegs 144 formed for cheesed metal 140 are fully bordered or landed on a corresponding substrate peg 132, which are shown in phantom in FIG. 1B. In addition, each dielectric peg 144 is diametrically larger than a corresponding substrate peg 132 such that cheesed metal 140 is sealed from substrate 104. In this fashion, diffusion of cheese metal 140 in the form of copper (Cu) into substrate 104 can be prevented. In addition, this structure prevents STI corners on copper cheesed metal 140, thus reducing the likelihood of a liner failure and Cu diffusion into substrate 104.

Cheesed metal 140 may also include a diffusion barrier/liner 146 (only labeled once in FIG. 1A) including at least one of the following: a diffusion barrier layer of a dielectric such as silicon nitride ($Si_3N_4$) deposited as discussed previously and/or a conductor such as a typical refractory metal liner layer, e.g., titanium nitride (TiN), tantalum (Ta), tungsten (W), tantalum nitride (TaN), or other refractory metal liner(s), as known in the art. Diffusion barrier/liner 146 may be deposited using any known method, such as physical vapor deposition (PVD), ALD, or chemical vapor deposition (CVD), as known in the art, and preferably is fabricated using a damascene process, i.e., post-CMP diffusion barrier/liner 146 coats the trench sides and bottom, as known in the art. Diffusion barrier/liner 146 provides further protection against diffusion of cheesed metal 140 in the form of copper (Cu) into substrate 104. Each of diffusion barrier material and/or liner materials of diffusion barrier/liner 146 is preferably optimized for coverage in the lower trench to prevent copper (Cu) diffusion. In one preferred embodiment, a coefficient of thermal expansion (CTE) of diffusion barrier/liner 146 substantially matches that of at least one of the following: substrate 104 and STI region 130. For example, silicon has a CTE of approximately 3.0, while tungsten (W) has a CTE of approximately 4.5. Accordingly, a tungsten diffusion barrier/liner 146 may be used to match the CTEs. A thick diffusion barrier/liner 146 in the range of approximately 50-100 nm is also preferred. Diffusion barrier/liner 146 minimizes thermal stress on, for example, an interface between ground shield 100 and substrate 104, which prevents copper diffusion into substrate 104 by minimizing thermal stress on diffusion barrier/liner 146.

Figure 2A:
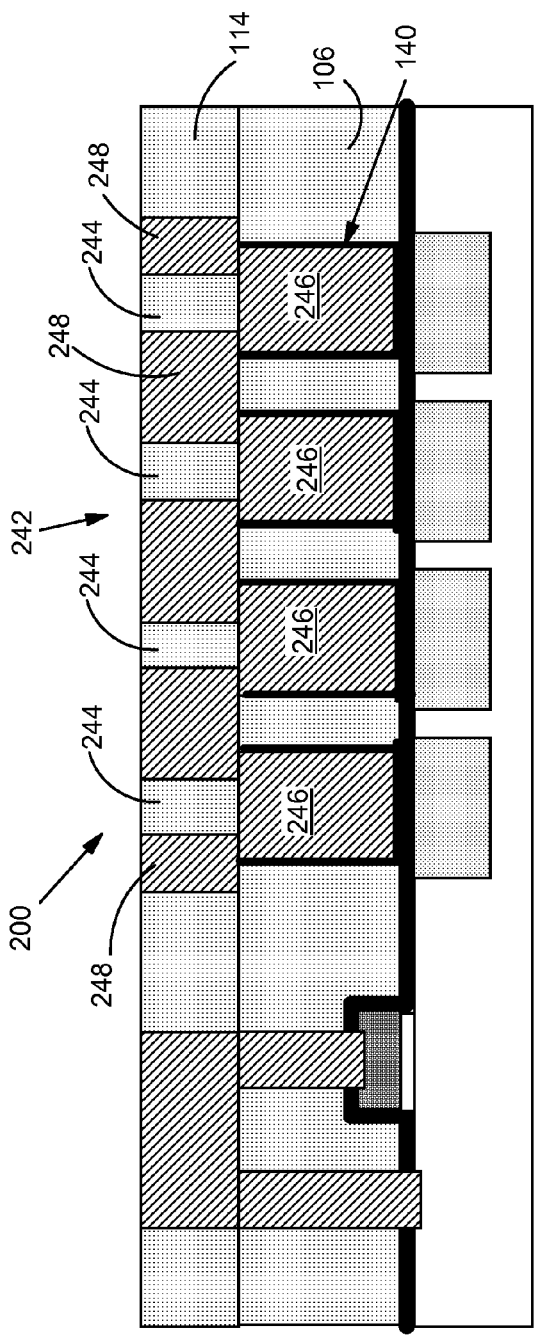
FIGS. 2A-B show a second embodiment of a ground shield according to the invention.
Figure 2B:
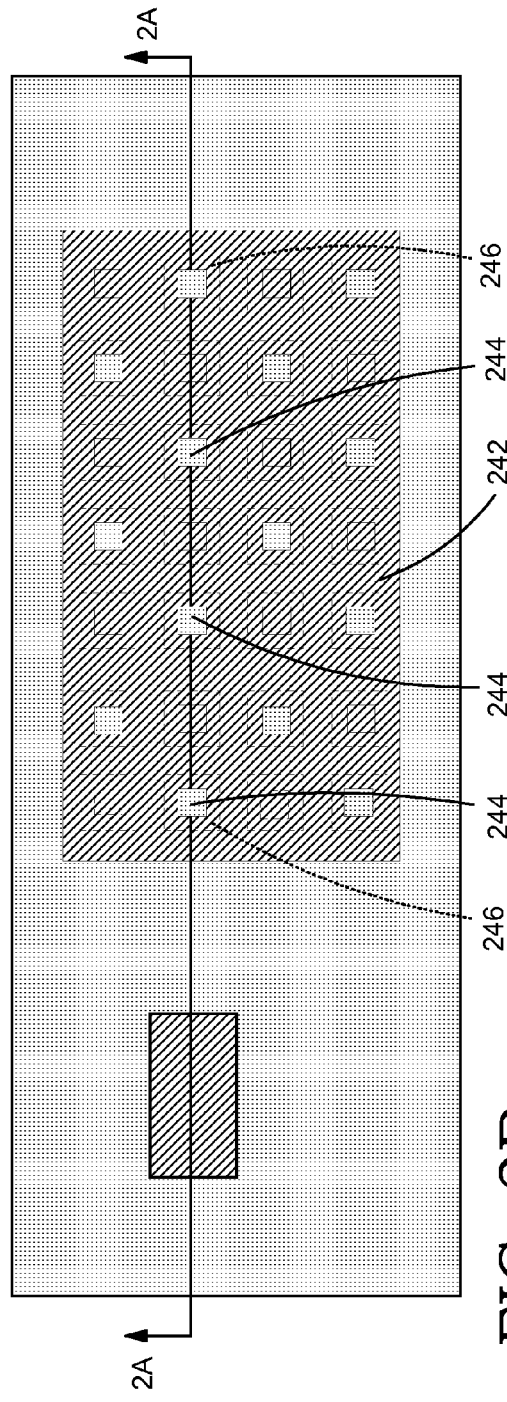

FIGS. 2A-B show a second embodiment of a ground shield 200. FIG. 2B shows a plan view of FIG. 2A, and FIG. 2A shows a cross-sectional view along line 2A-2A of FIG. 2B. Ground shield 200 is substantially similar to ground shield 100 of FIGS. 1A-B, except that it includes a cheesed metal region 242 to prevent dishing because region 242 is fabricated using a damascene process unlike layer 110 (FIG. 1A), which is fabricated using a subtractive etch process. Cheesed metal region 242 is positioned in an inter-metal dielectric (IMD) layer 114. IMD layer 114 may include any now known or later developed inter-metal dielectric material. Typical inter-metal dielectric layers are deposited using spin-on, or PECVD methods and can include $SiO_2$, fluorinated $SiO_2$, SiCOH, porous SiCOH, silicon low-k dielectric (SiLK™) (available from Dow Chemical), and the like. That is, in certain instances, metal region 142 (FIGS. 1A-B) may be so large that it requires cheesing to prevent dishing during chemical mechanical polish (CMP) planarization. In this case, cheesed metal region 242 includes a plurality of dielectric pegs 244 (of IMD layer 114). Each of the plurality of dielectric pegs 244 overlies a corresponding metal portion 246 (shown in phantom in FIG. 2B) of cheesed metal 140 and has a diameter smaller than a corresponding metal portion 246 of cheesed metal 140 such that the metal of cheesed metal 140 is covered by metal pegs 248 of cheesed metal region 242. In other words, metal pegs 248 of cheesed metal region 242 are non-coincidental with metal portions 246 of cheesed metal 140. This structure also reduces resistance in IMD layer 114 and PMD layer 106. In this embodiment, both cheesed metal region 242 and cheesed metal 140 may include copper (Cu), as discussed previously. In addition, metal region 242 does not need to fully cover cheesed metal 140, as in FIGS. 1A-B, although this is desirable to minimize the eddy current resistance.

Although particular metals for ground shields 100, 200 have been described, it should be recognized that various metals can be used. For example, cheesed metal 140 and/or metal region 142, 242 may include the following elements or their alloys: copper (Cu), aluminum copper (AlCu), aluminum (Al), silver (Ag) or tungsten (W). In addition, contacts 120 (FIG. 1A) may include various metals such as tungsten (W), copper (Cu), which may or may not match cheesed metal 140 and/or metal region 142, 242.

Ground shields 100, 200 provide a low resistance, very thick copper (Cu) damascene level at a first metal (M1) level for passive RF elements in conjunction with the standard BEOL integration. If copper (Cu) is used for both the wiring level and the underlying ground shield, the wire height is approximately 300 nm, and the contact height is approximately 600 nm, then the combined ground shield resistance will be approximately 0.18 ohms/square as compared to approximately 0.5 ohms/square for a ground shield composed of first metal (M1) only. The resistance exhibited may be in the range of approximately 0.1 to approximately 1.0 ohm/square.

Figure 3:
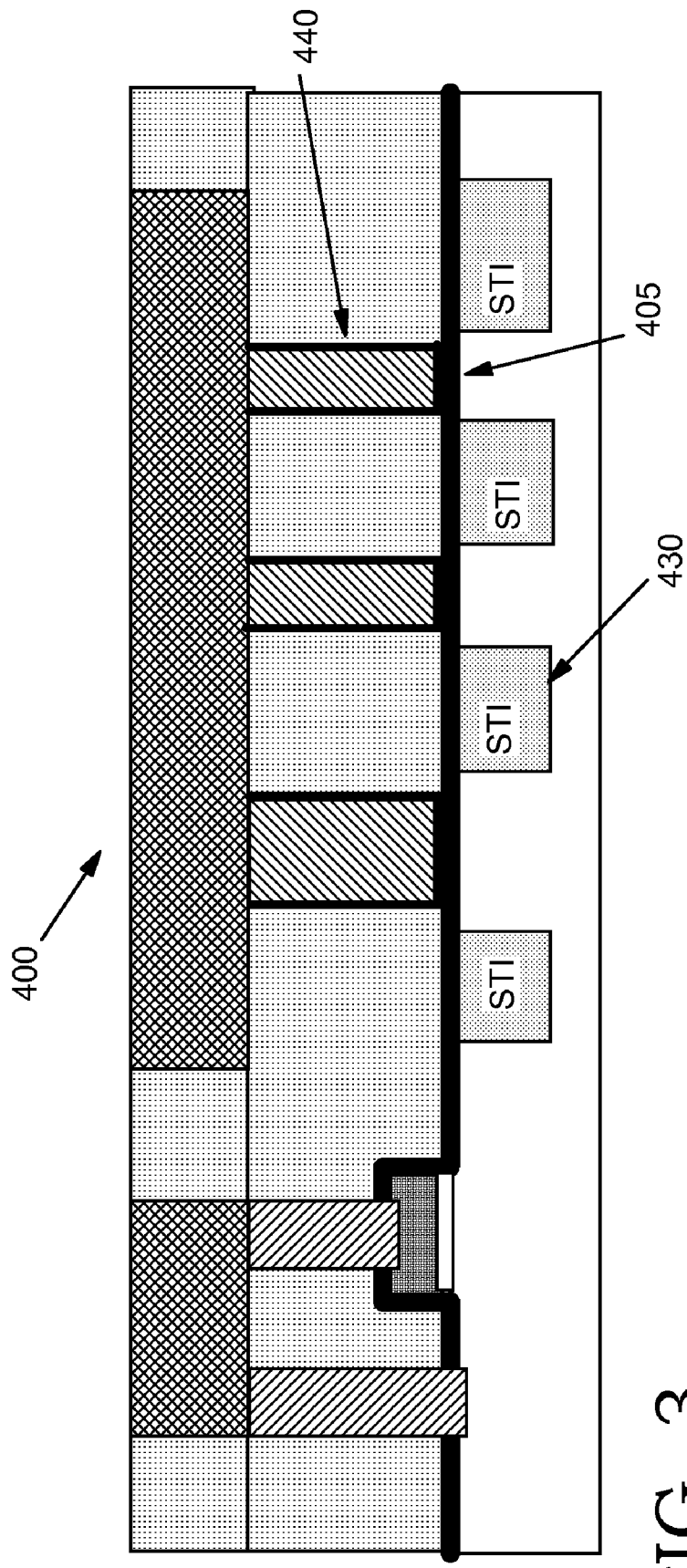
FIG. 3 shows a third embodiment of a ground shield according to the invention.

In an alternative embodiment, shown in FIG. 3, a copper ground shield 400 may land on silicided silicon (RX) region 405 of substrate 104 to avoid potential copper diffusion into substrate 104. In this case, cheesed metal 440 is never coincident with a STI region 430.

Turning to FIGS. 4A-C, 5A-D and 6A-E, various embodiments of methods of forming a ground shield will now be described.

Referring to the FIGS. 4A-C, a 'ground-up' embodiment of forming a ground plane 100, 200 will now be described. In a first step, shown in FIG. 4A, typical processing is performed for providing substrate 104 having STI region 130 therein and PMD layer 106 separated from substrate 104 by etch stop layer 108. This step may include conventional steps for, for example, forming substrate 104, etching to form STI region 130, depositing STI dielectric, planarizing, depositing etch stop layer 108 and depositing PMD layer 106. As described above, STI region 130 is cheesed and includes a plurality of substrate pegs 132.

Next, as also shown in FIG. 4A, a ground shield damascene structure 300 is formed in PMD layer 106 to etch stop layer 108. Ground shield damascene structure 300 includes a plurality of dielectric pegs 148 formed from PMD layer 106. Ground shield damascene structure 300 is preferably formed such that each dielectric peg 148 is horizontally aligned (as in FIGS. 1A-B and 2A-B) with a respective one of substrate pegs 132. In addition, each of the plurality of dielectric pegs 148 are bordered by making them diametrically larger than a corresponding substrate peg 132 for reasons described above. Although not necessary, forming ground shield damascene structure 300 may also include simultaneously forming a contact via damascene structure 302 in PMD layer 106 for contact vias 120 (shown filled with a metal such as tungsten (W)). If contact vias 120 are formed separately, the steps may include, for example, separately forming contact via damascene structure 302 by etching, filling contact via damascene structure 302 with a liner (not shown) and CVD tungsten (W), as discussed previously, planarizing excess liner and tungsten, and conventional cleaning. These steps would then be followed by an etching to form ground shield damascene structure 300.

Next, as shown in FIG. 4B, a metal 304 is formed in ground shield damascene structure 300, e.g., by conventional deposition techniques, to form cheesed metal 140 using plurality of dielectric pegs 148. As noted above, cheesed metal 140 extends to etch stop layer 108.

As described above, in one preferred embodiment, diffusion barrier/liner 146 (FIG. 4A) may be formed prior to metal 304 formation, and may have a CTE that substantially matches a selected one of substrate 104 and STI region 130. For deposition of copper (Cu), for example, this step may also include conducting: conventional precursor cleans, deposition of a diffusion barrier/liner 146 (FIG. 1A) including deposition of at least one of the following: a copper diffusion barrier layer (e.g., silicon nitride ($Si_3N_4$) and any refractory metal such as titanium nitride (TiN), tantalum nitride (TaN), tantalum (Ta), etc. Further processing for copper (Cu) may include: depositing a copper seed material, electroplating copper, planarization and final cleans.

In one embodiment, shown in FIGS. 1A-B, contact vias 120 and cheesed metal 140 do not include the same metals. That is, a deposited contact material in contact via damascene structure 302 (FIG. 4A) is different than cheesed metal 140. For example, in FIGS. 1A-B as described above, cheesed metal 140 includes copper (Cu) and contacts 120 include tungsten (W). (In FIGS. 1A-B, first metal level 110 includes aluminum copper (AlCu).) However, it is possible that contacts 120 and cheesed metal 140 (FIGS. 1A-B and 2A-B) include the same metal, e.g., copper (Cu). This situation is shown in FIGS. 2A-B in which contacts 120 and cheesed metal 140 include copper (Cu). In this case, ground shield damascene structure 300 and contact via damascene structure 302 can be filled simultaneously to form cheesed metal 140 and contact vias 120 simultaneously.

Figure 4C:
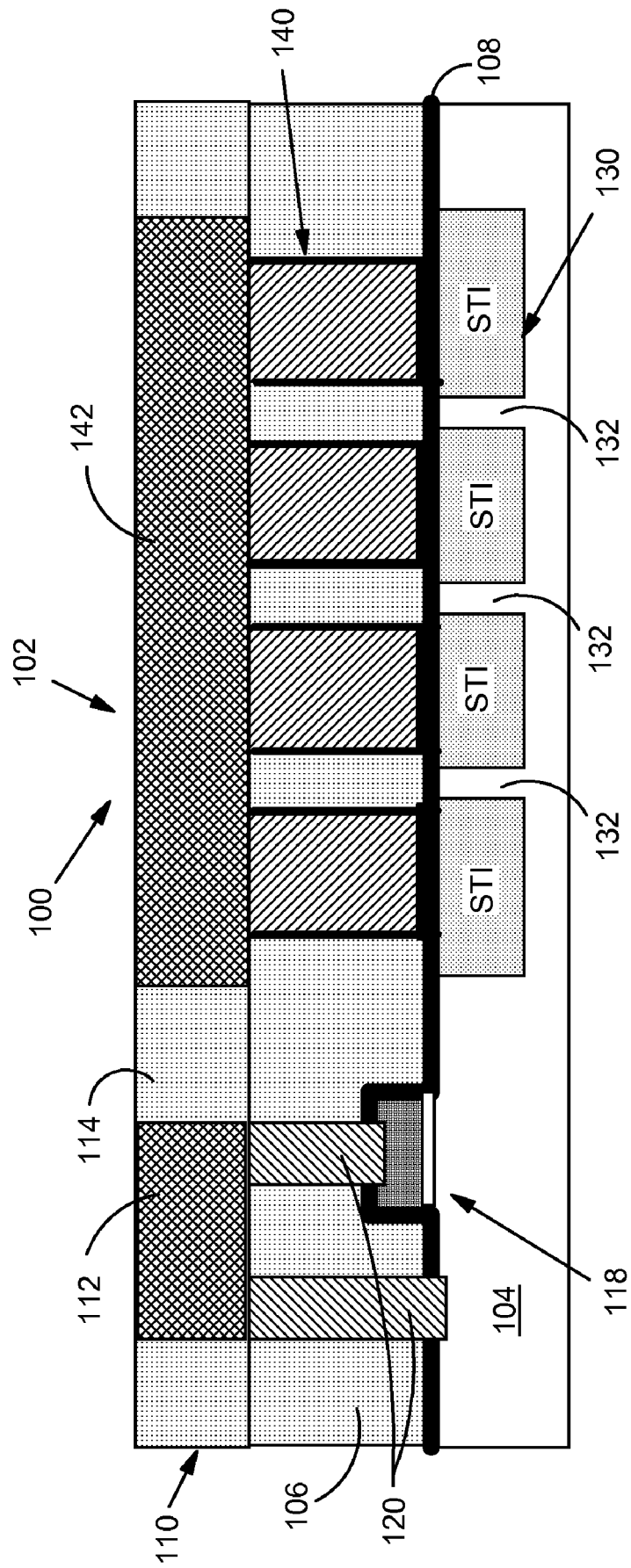

FIG. 4C shows a next step of forming a metal region 142, 242 (FIGS. 1A-B and 2A-B, respectively) over cheesed metal 140 to form ground shield 100, 200. FIG. 3C shows the FIGS. 1A-B embodiment only. This step may include conducting conventional inter-metal dielectric (IMD) material 114 deposition, patterning, etching of an area for metal region 142, 242 openings along with an area for metal wiring 112, cleaning, depositing a metal to form metal region 142, 242 and metal wiring 112, and planarization. Where cheesed metal 140 is copper (Cu), a dielectric-copper diffusion barrier 146 such as silicon nitride ($Si_3N_4$), silicon carbide (SiC) or silicon carbon nitride (SiCN) is preferably first deposited, i.e., as shown in FIG. 4A. As described above, in one embodiment, metal region 142 is formed over cheesed metal 140 such that cheesed metal 140 is fully landed within a periphery of metal region 142, as shown in FIGS. 1A-B. In another embodiment, the metal region is formed as a cheesed metal region 242, as shown in FIGS. 2A-B, including a plurality of dielectric pegs 244. As shown in FIG. 2A, each of IMD layer 114 peg 244 is over a corresponding metal portion 246 of cheesed metal 140 and is diametrically smaller than the corresponding metal region of cheesed metal 142.

Turning to FIGS. 5A-D, another embodiment in which a ground shield 500 (FIG. 5D) is formed using a double damascene process at a first metal (M1) level is shown. In a first step, shown in FIG. 5A, this embodiment includes typical processing for providing substrate 104 having STI region 130 therein, PMD layer 106 separated from substrate 104 by etch stop layer 108, contacts 120 and IMD layer 114. This step may include conventional steps for, for example, forming substrate 104, etching to form STI region 130, depositing STI dielectric, planarizing, depositing etch stop layer 108, depositing PMD layer 106, etching to open contact openings, filling contact openings with a liner (not shown) and CVD tungsten (W), as discussed previously, planarizing excess liner and tungsten, conventional cleaning, and depositing IMD layer 114. As described above, STI region 130 is cheesed and includes a plurality of substrate pegs 132.

Next, as shown in FIG. 5B, a first damascene structure 501 is formed in IMD layer 114 including an area 502 for a metal wire and an area 504 for a metal region of a ground shield.

Figure 5C:
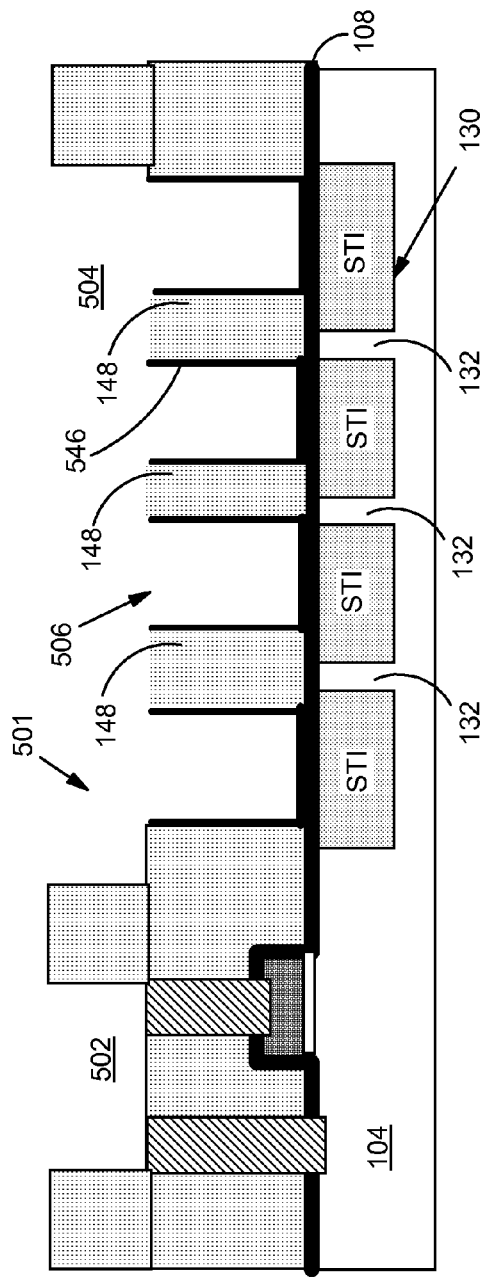
Figure 5D:
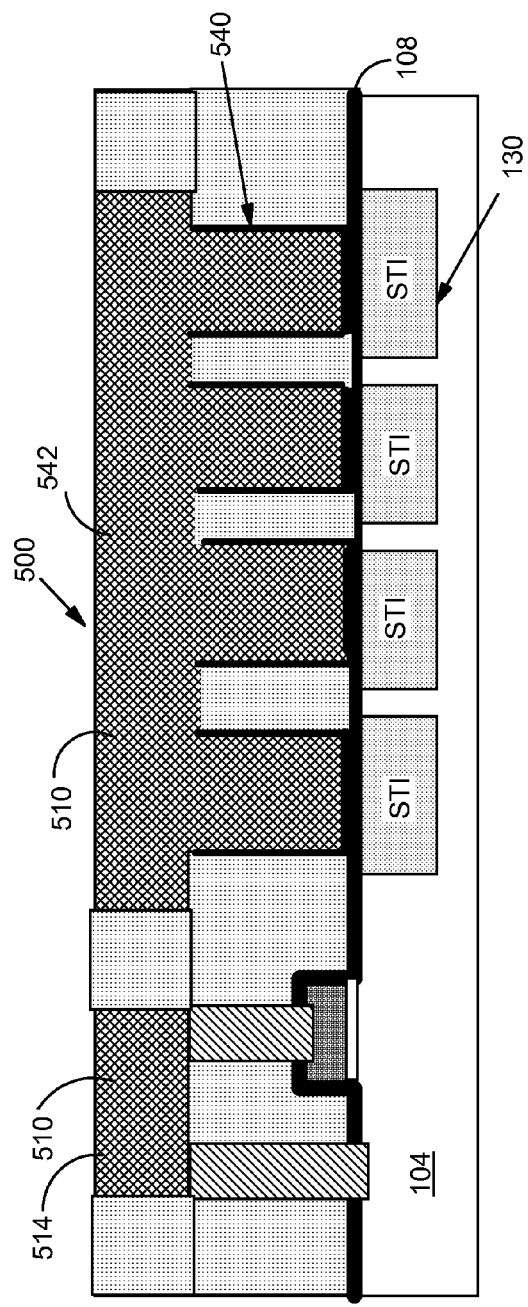

Next, as shown in FIG. 5C, a second damascene structure 506 is formed in PMD layer 106 including an area for the cheesed metal having a plurality of dielectric pegs 148. A diffusion barrier/liner 546 may be deposited, and as shown in FIG. 5D, is followed by forming a metal 510 in damascene structures 501 and 506 (FIG. 5C), e.g., by conventional deposition techniques, to form ground shield 500 including cheesed metal 540 (using plurality of dielectric pegs 148 (FIG. 5C)) and metal region 542. In addition a metal wire 514 is formed for contacts 120. As described above, cheesed metal 540 extends to etch stop layer 108. As also described above, in one preferred embodiment, a diffusion barrier/liner 546 has a CTE that substantially matches a selected one of substrate 104 and STI region 130.

Referring to FIGS. 6A-E, another embodiment in which a ground shield 600 (FIG. 6E) is formed using a triple damascene process is shown. In a first step, shown in FIG. 6A, this embodiment includes typical processing for providing substrate 104 having STI region 130 therein, and a dielectric layer 606 separated from substrate 104 by etch stop layer 108. This step may include conventional steps for, for example, forming substrate 104, etching to form STI region 130, depositing STI dielectric, planarizing, depositing etch stop layer 108, and depositing dielectric layer 606. As described above, STI region 130 is cheesed and includes a plurality of substrate pegs 132. In addition, at this stage, etching is performed to open a first damascene structure 618 including at least one contact opening area 620 (two shown) in dielectric layer 606 to etch stop layer 108.

Figure 6A:
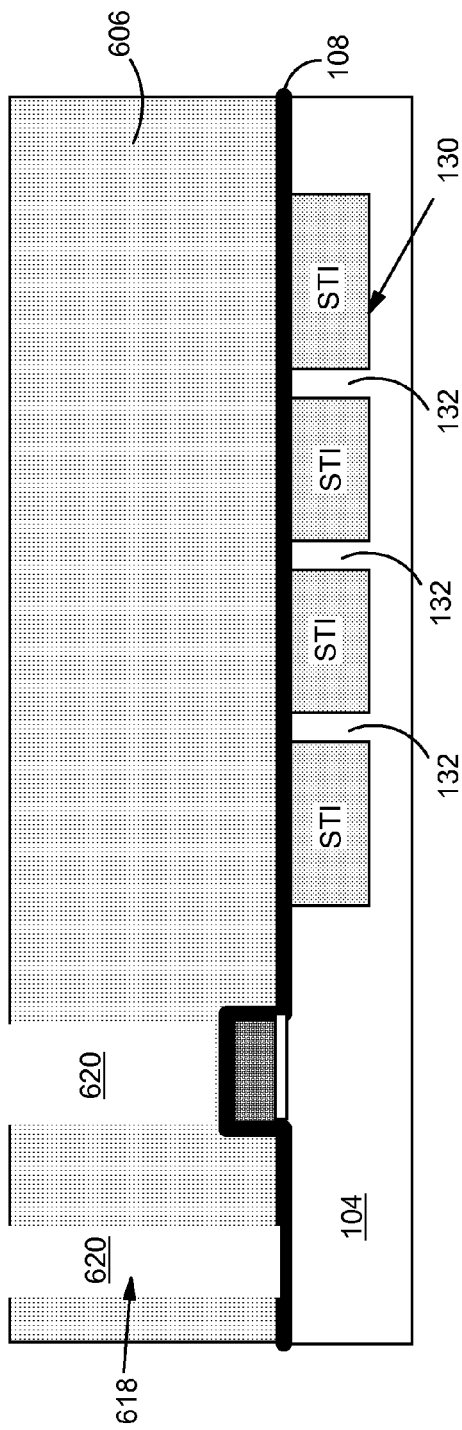
FIGS. 6A-E show another embodiment of a method of forming a ground shield according to the invention.
Figure 6B:
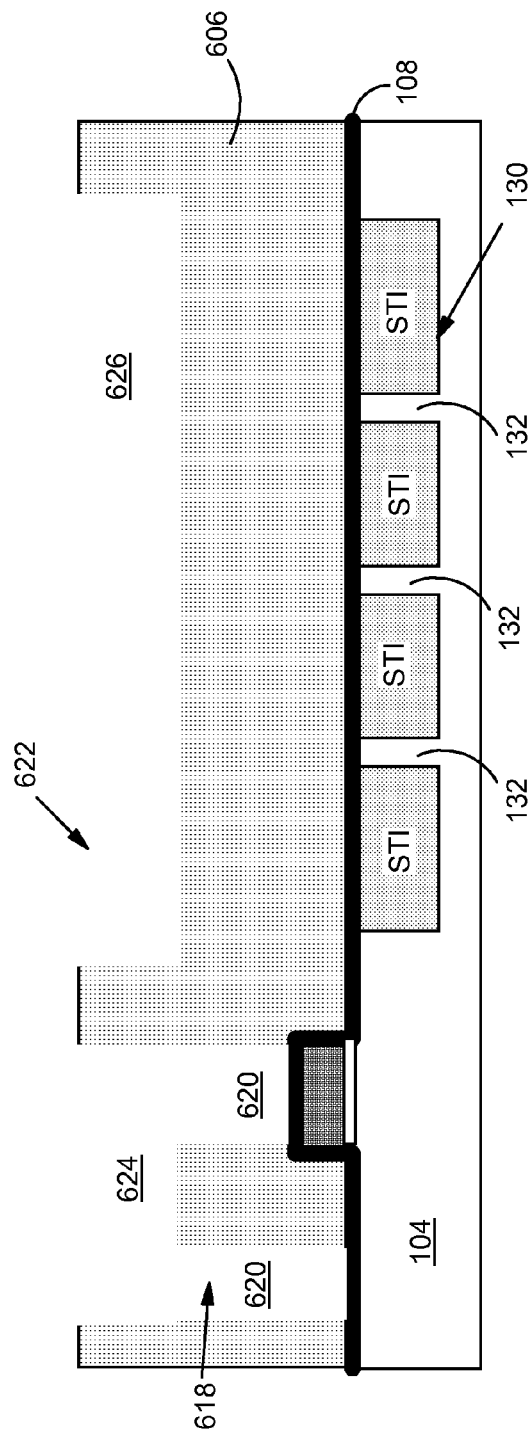
Figure 6C:
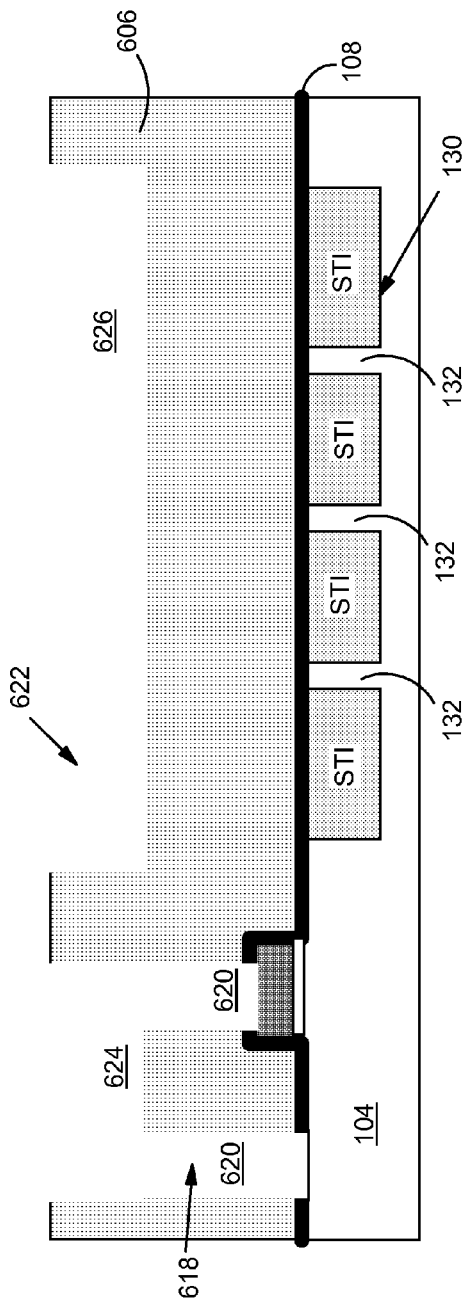
Figure 6D:
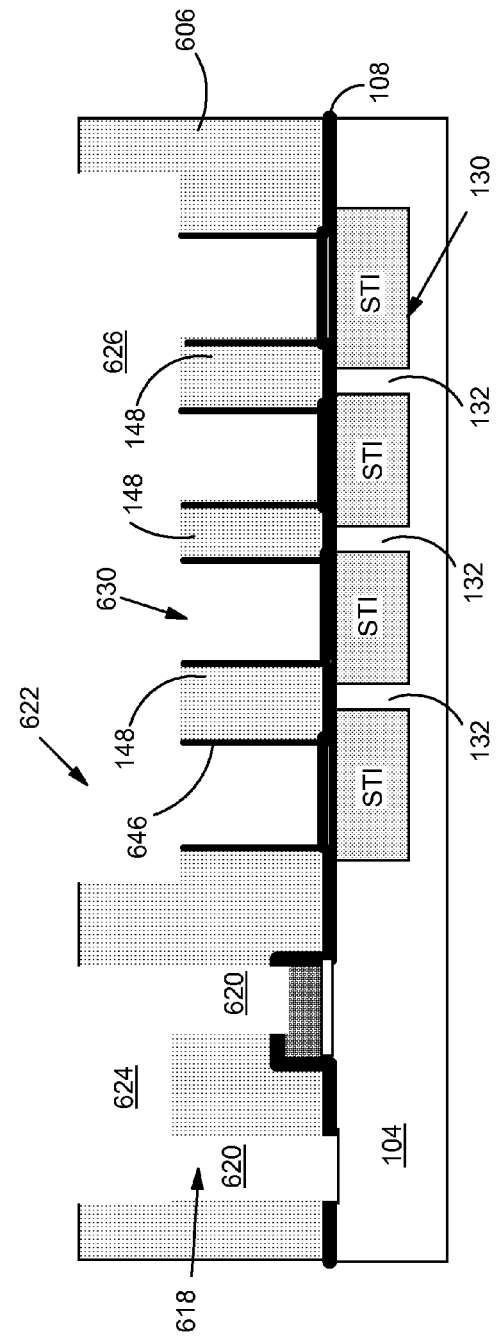
Figure 6E:
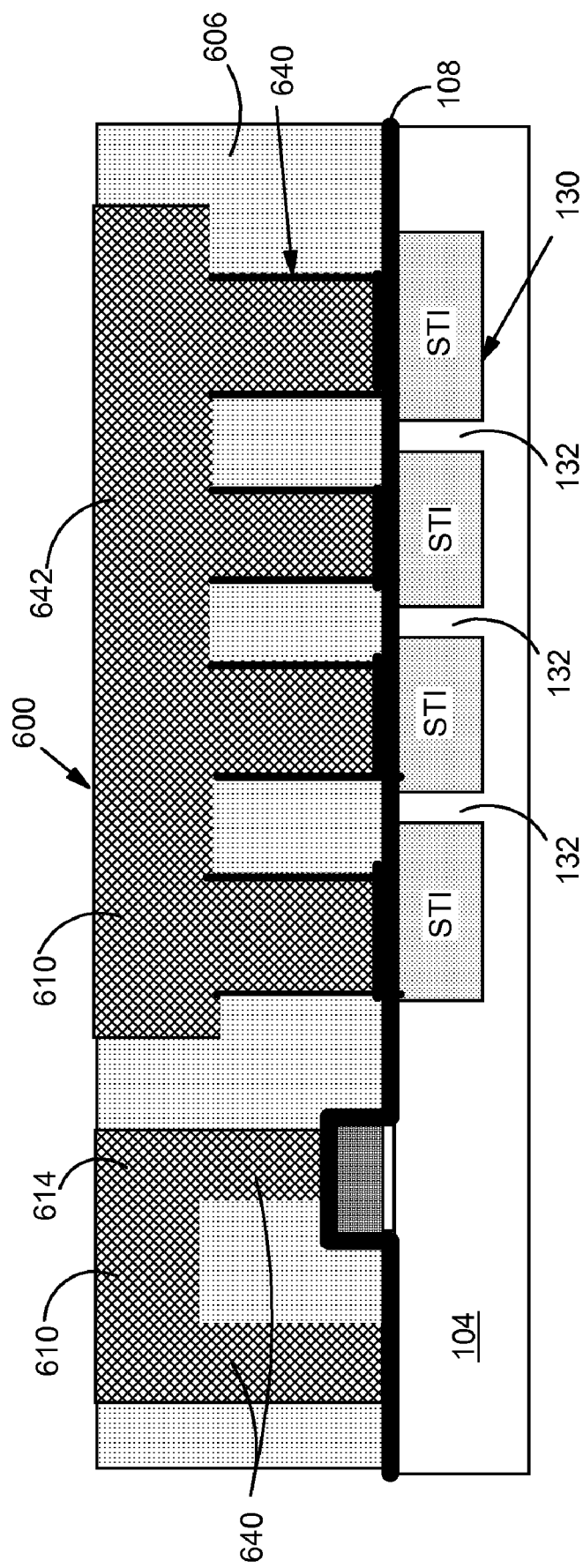

Next, as shown in FIG. 6B, a second damascene structure 622 is formed in dielectric layer 606 including an area 624 for a metal wire and an area 626 for a metal region of ground shield 600 (FIG. 6E). Next, as shown in FIG. 6C, contact opening area(s) 620 of first damascene structure 618 are extended through etch stop layer 108. As shown in FIG. 6D, a next step includes forming a third damascene structure 630 in dielectric layer 606 having an area for the cheesed metal having a plurality of dielectric pegs 148. As shown in FIG. 6D, a diffusion barrier/liner 646, as described above, may also be deposited at this stage.

Finally, as shown in FIG. 6E, a metal 610 is formed in damascene structures 618, 622 and 630 (FIG. 6B), e.g., by conventional deposition techniques, to form ground shield 600 including cheesed metal 640 (using plurality of dielectric pegs 148 (FIG. 6D)) and metal region 642. In addition contacts 640 and a metal wire 614 are formed. As described above, cheesed metal 640 extends to etch stop layer 108. As also described above, in one preferred embodiment, a diffusion barrier/liner 646 (FIG. 6D) has a CTE that substantially matches a selected one of substrate 104 and STI region 130.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A structure comprising:
    a substrate having a dielectric layer positioned thereover;
    a metal level positioned over the dielectric layer; and
    a ground shield including:
        a cheesed metal positioned within the dielectric layer, and
        a metal region positioned within the metal level over the cheesed metal, wherein the metal region provides continuous coverage over the cheesed metal.

2. The structure of claim 1, wherein the cheesed metal is fully landed within a periphery of the metal region.

3. The structure of claim 2, wherein the metal region includes aluminum copper (Al—Cu) and the cheesed metal includes copper (Cu).

4. The structure of claim 1, wherein the metal region is cheesed and includes a plurality of dielectric pegs, wherein each of the plurality of dielectric pegs overlies a corresponding metal portion of the cheesed metal and has a diameter smaller than a corresponding metal portion.

5. The structure of claim 4, wherein the cheesed metal and the metal region include copper (Cu).

6. The structure of claim 1, wherein the cheesed metal extends to a diffusion barrier layer that is positioned over the substrate.

7. The structure of claim 1, further comprising a silicon trench isolation (STI) region in the substrate, wherein the ground shield is fully landed within a periphery of the STI region.

8. The structure of claim 7, wherein the STI region includes cheesing having a plurality of substrate pegs, and wherein each of a plurality of dielectric pegs formed by the cheesed metal are fully landed on a corresponding substrate peg, and is diametrically larger than a corresponding substrate peg such that the cheesed metal is sealed from the substrate.

9. The structure of claim 1, wherein the metal level further includes an active metal wire coupled to an active contact via in the dielectric layer.

10. The structure of claim 1, the cheesed metal includes copper and lands on a silicided silicon (RX) region of the substrate.

11. The structure of claim 1, wherein the ground shield includes at least one of the following: a liner and a diffusion barrier, for the cheesed metal, and
    wherein a coefficient of thermal expansion of the at least one liner and diffusion barrier substantially matches that of at least one of the following: the substrate and a silicon trench isolation (STI) region in the substrate.

12. The structure of claim 11, wherein the at least one liner and diffusion barrier includes at least one of the following: a dielectric and a conductor.

13. The structure of claim 1, wherein the cheesed metal is selected from the group consisting of: copper (Cu), aluminum copper (AlCu), aluminum (Al), silver (Ag), tungsten (W) and an alloy thereof.

14. The structure of claim 1, wherein the ground shield has a sheet resistance of approximately 0.1 to approximately 1.0 ohms/square.

15. A ground shield for a semiconductor device, the ground shield comprising:
    substrate;
    a metal region in a first metal level of the semiconductor device;
    a cheesed metal positioned in a dielectric layer located between the substrate and the metal region; and a plurality of dielectric pegs of the cheesed metal being aligned with a fill peg located in the substrate between a cheesed silicon trench isolation (STI) region, wherein each dielectric peg from the plurality of dielectric pegs is located substantially over the corresponding fill peg.

16. The ground shield of claim 15, wherein the cheesed metal is fully landed within a periphery of the metal region and a periphery of the underlying, cheesed STI region.

17. The ground shield of claim 15, wherein each dielectric peg is diametrically larger than a corresponding fill peg such that the cheesed metal is sealed from the substrate.

18. The structure of claim 15, wherein the dielectric layer further includes a contact via.

19. A ground shield for a semiconductor device, the ground shield comprising:

substrate;

a first cheesed metal region in a first metal level of the semiconductor device;

a second cheesed metal region positioned in a dielectric layer located between the substrate and the first cheesed metal region; and a plurality of dielectric pegs of the second cheesed metal region being aligned with a fill peg located in the substrate between a cheesed silicon trench isolation (STI), wherein each dielectric peg from the plurality of dielectric pegs is located substantially over a corresponding fill peg.

* * * * *